United States Patent
Ju et al.

(10) Patent No.: US 10,644,698 B2
(45) Date of Patent: May 5, 2020

(54) OPTICAL DIAL DEVICE

(71) Applicant: Acer Incorporated, New Taipei (TW)

(72) Inventors: Tai Ju, New Taipei (TW); Chueh-Pin Ko, New Taipei (TW); Chih-Chiang Chen, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 0 days.

(21) Appl. No.: 16/226,987

(22) Filed: Dec. 20, 2018

(65) Prior Publication Data
US 2019/0288687 A1    Sep. 19, 2019

(30) Foreign Application Priority Data
Mar. 19, 2018 (TW) .............................. 107109251 A

(51) Int. Cl.
*H03K 17/968* (2006.01)
*G06F 3/041* (2006.01)

(52) U.S. Cl.
CPC .......... *H03K 17/968* (2013.01); *G06F 3/041* (2013.01); *H03K 2217/94063* (2013.01)

(58) Field of Classification Search
CPC .................. H03K 17/968; H03K 2217/94063
See application file for complete search history.

(56) References Cited

U.S. PATENT DOCUMENTS 6,794,628 B2 *   9/2004   Yahav .................. H01L 31/125
                                                 250/214 R

* cited by examiner

*Primary Examiner* — Hai L Nguyen
(74) *Attorney, Agent, or Firm* — McClure, Qualey & Rodack, LLP

(57) ABSTRACT

An optical dial device includes a base and a drum. In the base, optical sensing elements are disposed at a predetermined height along the circumference of the side surface of the base. The drum covers the base in a manner that is movable and rotatable relative to the base. The drum includes an opening and a reflective structure disposed along the circumference of the inner wall surface of the drum and located a first distance away from the opening. There is a spiral structure disposed along the circumference of the inner wall surface of the drum and located a second distance away from the opening. The spiral structure causes the distance between the inner wall surface of the drum and the side surface of the base to vary continuously along the circumference.

8 Claims, 6 Drawing Sheets

OPTICAL DIAL DEVICE

CROSS REFERENCE TO RELATED APPLICATIONS

This application claims priority of Taiwan Patent Application No. 107109251, filed on Mar. 19, 2018, the entirety of which is incorporated by reference herein.

BACKGROUND OF THE INVENTION

Field of the Invention

The present invention relates to an optical dial device, and more particularly to an optical dial device capable of accepting various operation inputs.

Description of the Related Art

Touch panels have become ubiquitous and are currently a feature in a wide variety of devices. Moreover, various types of auxiliary input devices such as stylus pens have been introduced in order to provide users with more options. Having only a stylus pen does not meet the diverse needs of users, however. Therefore, dial devices, for example, have been introduced onto the market. When a dial device is connected to an electronic product and operated by the user, the user can press the dial device to input a confirmation command to the electronic product, and the user can also rotate the dial device to input a menu-selection command.

However, in addition to the above-mentioned pressing and rotating operation modes, if more operation modes can be added to the dial device and defined by the users, the functionality and the convenience of the dial device will be greatly improved.

BRIEF SUMMARY OF THE INVENTION

A detailed description is given in the following embodiments with reference to the accompanying drawings.

One of the purposes of the present invention is to provide an optical dial device capable of receiving a variety of operation inputs, as well as an optical detection method so that the above-described problems can be solved.

The present invention provides an optical dial device that includes a base and a drum. A plurality of optical sensing elements are disposed at a predetermined height along a circumference of a side surface of the base. The drum covers the base in such a manner that the drum may be moved close to the base, away from the base, and rotatable relative to the base. The drum includes an opening, a reflective structure, and a spiral structure. The opening accommodates the base. The high reflective structure is disposed along the circumference of an inner wall surface of the drum and located a first distance away from the opening. The spiral structure is disposed along the circumference of the inner wall surface of the drum and located a second distance away from the opening. The spiral structure continuously varies the distance between the inner wall surface of the drum and the side surface of the base along the circumference. The second distance is shorter than the first distance. The spiral structure is located at the predetermined height when no force is applied on optical dial device.

In the above optical dial device, the reflective structure is made of a material having a higher reflectivity than the spiral structure. When the entire drum and the base are close to each other based on an operation input received by the optical dial device, the reflective structure is moved to the predetermined height, such that the plurality of optical sensing elements simultaneously receive light reflection signals having high intensities, and the optical dial device outputs an operation signal indicating a normal pressing operation to an external device.

In the above optical dial device, the reflective structure is made of a material having a lower reflectivity than the spiral structure. When the entire drum and the base are close to each other, the reflective structure is moved to the predetermined height, such that the plurality of optical sensing elements simultaneously receive light reflection signals having low intensities, and the optical dial device outputs an operation signal indicating a normal pressing operation to an external device.

In the above optical dial device, when the drum rotate relative to the base based on an operation input received by the optical dial device, light reflection signals received by the plurality of optical sensor elements are continuously raised or lowered, so that the optical dial device outputs an operation signal indicating a rotation operation to an external device.

In the above optical dial device, when the light reflection signals received by the plurality of optical sensing elements are continuously raised, the operation signal output by the optical dial device represents a first direction in a circumferential direction.

In the above optical dial device, when the light reflection signals received by the plurality of optical sensing elements are continuously lowered, the operation signal output by the optical dial device represents a second direction in the circumferential direction, wherein the second direction is opposite to the first direction.

In the above optical dial device, the reflective structure is made of a material having a higher reflectivity than the spiral structure. When one side of the drum and the base are moved close to each other and the other side of the drum is moved away from the base based on an operation received by the optical dial device, a portion of the reflective structure is moved to the predetermined height, so that at least one of the plurality of optical sensing elements receives light reflection signals having high intensities, and the remaining optical sensing elements receive light reflection signals having low intensities, thereby the optical dial device outputs an operation signal indicating an off-center pressing operation to an external device.

In the above optical dial device, the reflective structure is made of a material having a lower reflectivity than the spiral structure. When one side of the drum and the base are moved close to each other and the other side of the drum is moved away from the base based on an operation input received by the optical dial device, a portion of the reflective structure is moved to the predetermined height, so that at least one of the plurality of optical sensing elements receives light reflection signals having low intensities, and the remaining optical sensing elements receive light reflection signals having high intensities, thereby the optical dial device outputs an operation signal indicating an off-center pressing operation to an external device.

With the above embodiments, the present invention provides an optical dial device that can accept a variety of operation inputs to increase functionality and convenience.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
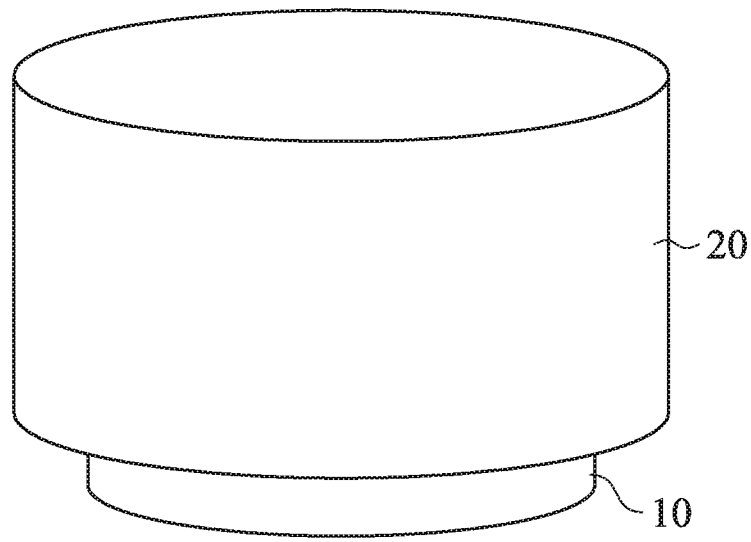
FIG. 1 is a perspective view of an optical dial device according to an embodiment of the present invention.

The following description provides many different embodiments or examples for implementing different features of the disclosure. Elements and arrangements in the examples below are merely used for concisely describing the present disclosure, which are not intended to limit the present disclosure. For example, the description of a structure in which a first feature is on or above a second feature includes that the first feature and the second feature are in direct contact with each other or there is another feature disposed between the first feature and the second feature such that the first feature and the second feature are not in direct contact.

The terms "first" and "second" of this specification are used only for the purpose of clear explanation and are not intended to limit the scope of the patent. In addition, terms such as "the first feature" and "the second feature" are not limited to the same or different features.

Spatially related terms, such as upper or lower, are used herein merely to describe briefly the relationship of one element or feature to another element or feature in the drawings. In addition to the directions described in the drawings, there are devices that are used or operated in different directions. The shapes, dimensions, and thicknesses in the drawings may not be drawn to scale or may be simplified for clarity of illustration, and are provided for illustrative purposes only.

Figure 2A:
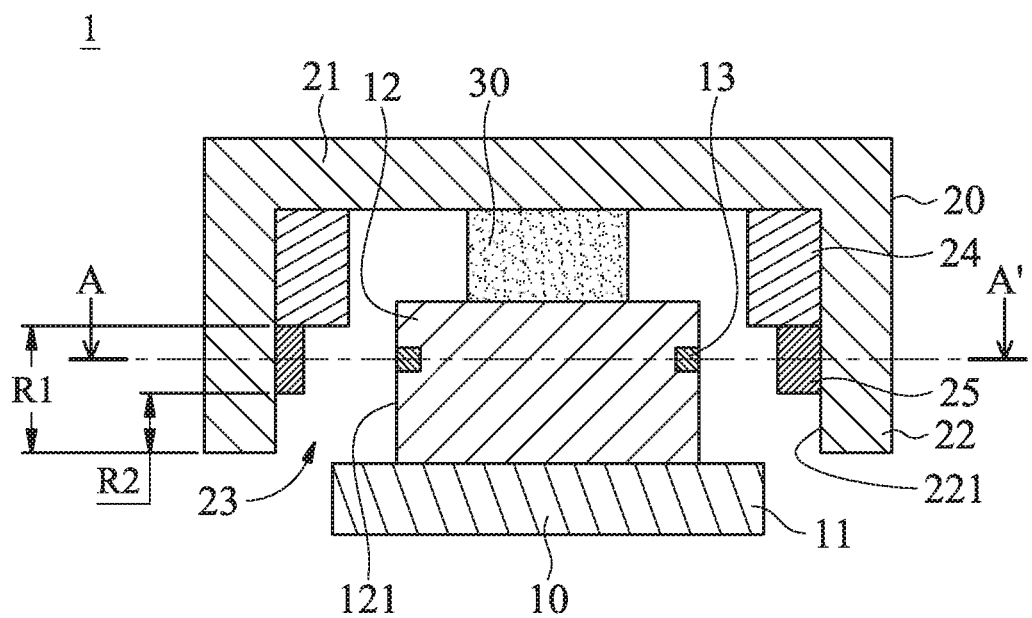
FIG. 2A is a vertical sectional view showing the optical dial device of FIG. 1.
Figure 2B:
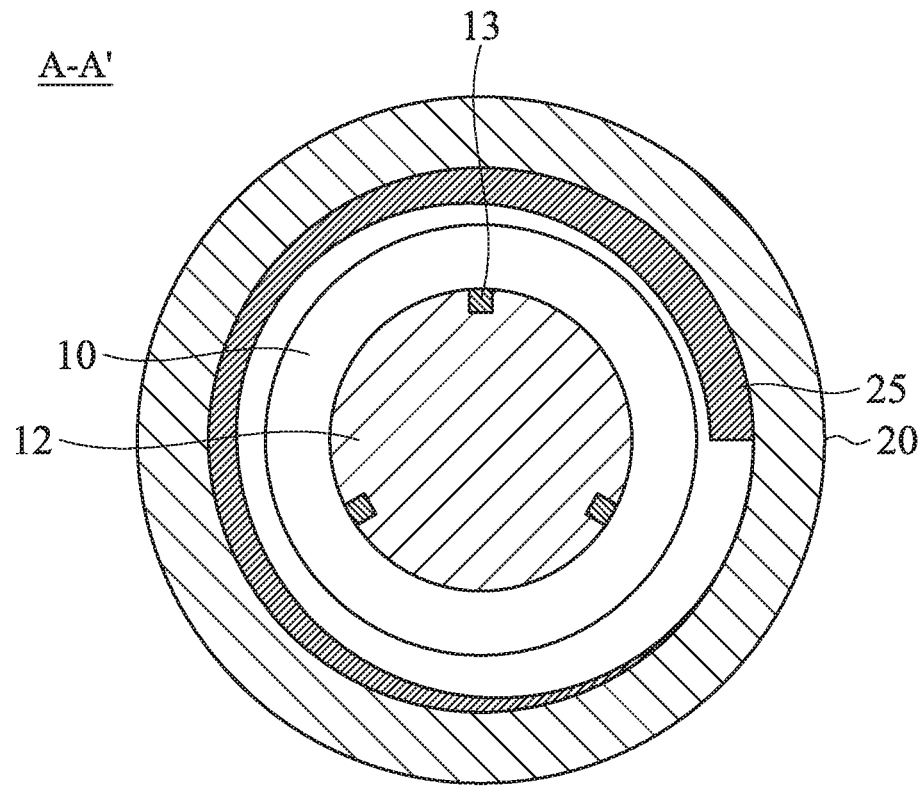
FIG. 2B is a cross-sectional view taken along a line A-A' of the optical dial device of FIG. 1.

FIG. 1 is a perspective view of an optical dial device according to an embodiment of the present invention. FIG. 2A is a vertical sectional view showing the optical dial device of FIG. 1. FIG. 2B is a cross-sectional view taken along a line A-A' of the optical dial device of FIG. 1. As shown in FIG. 1, the optical dial device 1 of the present invention includes a base 10 and a drum 20 that covers the base 10. The drum 20 may be pressed in the direction toward the base 10 or may be rotated relative to the base 10.

When the optical dial device 1 is placed on a device with a touch screen, the optical dial device 1 communicates with the device so that the input of the optical dial device 1 can operate according to the image displayed on the touch screen. For example, when the optical dial device 1 and the device with a touch screen are connected through WIFI or Bluetooth, the touch screen may display a menu accordingly. The user selects the desired option by rotating the optical dial device 1, and makes a confirmation by pressing the optical dial device 1.

The detailed structure of the optical dial device 1 is shown in FIGS. 2A and 2B. The base 10 includes a bottom portion 11, a column portion 12, and one or more optical sensing elements 13 disposed on a wall surface 121 of the column portion 12. The bottom portion 11 is configured to stably place on the device to be operated. The lower surface of the bottom portion 11 may be provided with one or more suction members or one or more magnets to be temporarily fixed the surface of the device, or may be provided with one or more electrode patterns to electrically couple with a device having the capability of sensing the electrode pattern(s). In this embodiment, the column portion 12 has a cylindrical shape and perpendicularly extends in the center of the bottom portion 11. In this embodiment, a plurality of optical sensing elements 13 are arranged on the wall surface 121 of the column portion 12. In one embodiment, the optical sensing elements 12 may be evenly arranged on the wall surface 121 at the same distance relative to the bottom portion 11. The optical sensing element 13 includes a light emitter and a light receiver (not shown in the figures). The light emitter emits light in a direction that is perpendicular to the wall surface 121, and the light receiver receives the reflected light. The operation mode of the optical dial device 1 is determined by the light intensity received by the light receiver.

The drum 20 includes a top cap 21, a side wall 22 standing upright (i.e., protruding) from the periphery of the top cap 21, an opening 23 surrounded by the side wall 22, a high reflective structure 24 formed on the inner wall surface 221 of the side wall 22, and a spiral structure 25 formed on the inner wall surface 221 of the side wall 22. The opening of the drum 20 covers the base 10 and the drum 20 is combined with the base 10 into an optical dial device 1. The high reflective structure 24 is disposed in a circumferential direction of the inner wall surface 221 at a first distance R1 from the opening 23, and the spiral structure 25 is disposed in a circumferential direction of the inner wall surface 221 at a second distance R2 from the opening 23. As shown in FIG. 2A, the first distance R1 is greater than the second distance R2. Namely, the high reflective structure 24 is formed at a higher position than the spiral structure 25.

An elastic body 30 is disposed between the top end of the column portion 12 of the base 10 and the top cover 21 of the drum 20. The base 10 and the drum 20 can be close to each other by the compression of the elastic body 30. In addition, the drum 20 is coupled to the base 10 via a mechanical member (not shown), so that the drum 20 can rotate around the base 10. When no external force is applied to the optical dial device 1 (i.e., the optical dial device 1 is not being operated by the user as shown in FIG. 2A), the optical sensing elements 13 face (i.e., are aligned to) the spiral structure 25 in the horizontal direction. Also, as shown in FIG. 2B, the spiral structure 25 is a structure that gradually increases the thickness of its wall surface in the clockwise direction. As a result, the distance between the wall surface 121 of the column portion 12 of the base 10 and the spiral structure 25 of the drum 20 decreases in the clockwise direction. The light intensity of the reflected light received by the optical sensing element 13 varies depending on the path length of the reflected light. The closer the optical sensing element 13 is to the reflective surface, the stronger the received light intensity is, and conversely the farther it is from the reflective surface, the weaker the received light intensity is.

Therefore, when the user rotates the optical dial device 1 in the clockwise direction (i.e., the drum 20 is rotated in the clockwise direction), each of the optical sensing elements 13 gradually becomes distant from the reflecting surface it faces and receives light reflection signals having continuously lowered intensities. When the optical sensing elements 13 receive the light reflection signals having continuously lowered intensities at the same time in at least two iterations of the sensing procedure, it can be determined that the optical dial device 1 is rotated in the clockwise direction. Accordingly, the optical dial device 1 outputs an operation signal indicating a clockwise rotation operation to an external device having a touch screen. On the other hand, when the user rotates the optical dial device 1 in the counterclockwise direction (i.e., the drum 20 is rotated in the counterclockwise direction), each of the optical sensing elements 13 gradually becomes close to the reflecting surface it faces and receives light reflection signals having continuously raised intensities. When the optical sensing elements 13 receive the light reflection signals having continuously raised intensities at the same time in at least two iterations of the sensing procedure, but the light reflection signals having raised intensities do not exceed a predetermined threshold value, it can be determined that the optical dial device 1 is rotated in the counterclockwise direction. Accordingly, the optical dial device 1 outputs an operation signal indicating a counterclockwise rotation operation to the external device having the touch screen.

Figure 3A:
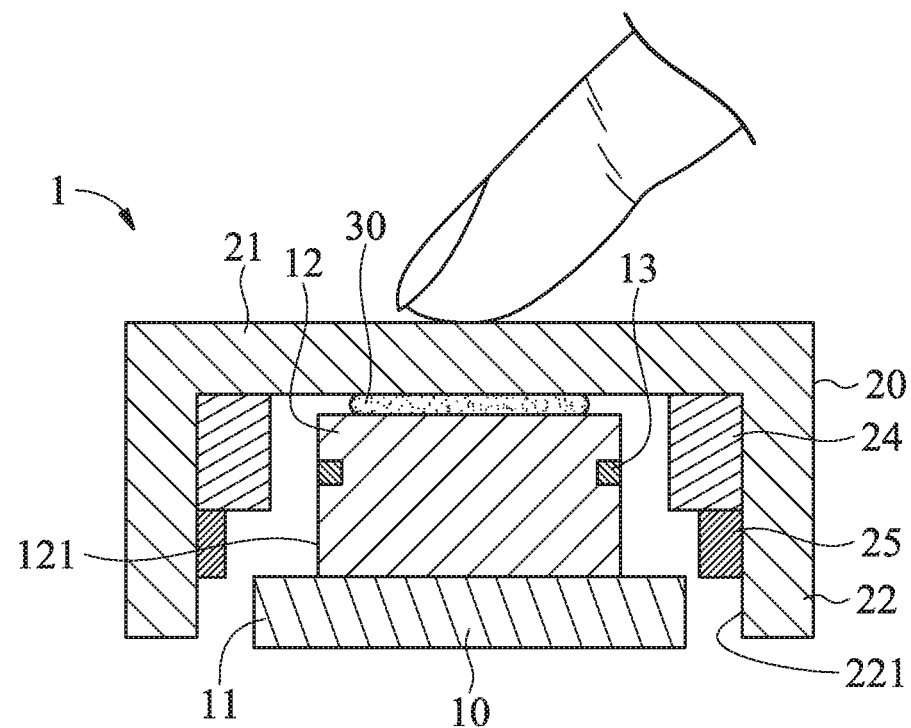
FIG. 3A is a vertical sectional view showing the optical dial device of FIG. 1 being pressed.
Figure 3B:
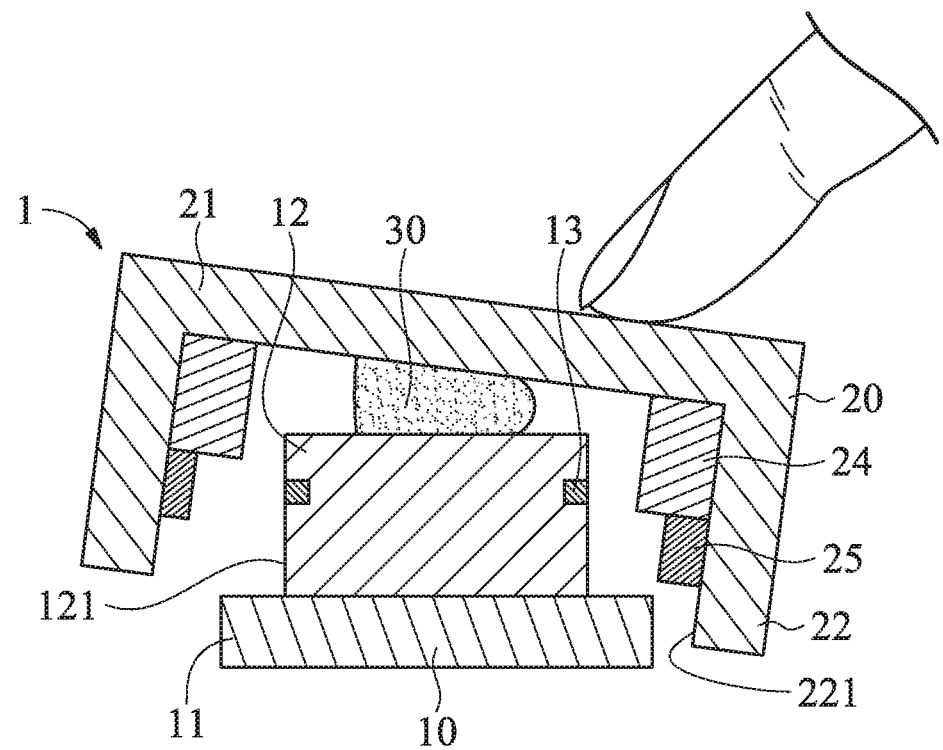
FIG. 3B is a vertical sectional view showing the optical dial device of FIG. 1 being pressed off center.

FIG. 3A is a vertical sectional view showing the optical dial device of FIG. 1 being pressed. FIG. 3B is a vertical sectional view showing the optical dial device of FIG. 1 being pressed off center. As shown in FIG. 3A, when the user presses toward the center of the optical dial device 1 (i.e., the center of the drum 20 is pressed downward), the elastic body 30 is compressed so that the drum 20 is lowered. In the embodiment of the present invention, the high reflective structure 24 will be lowered to the position facing the optical sensing elements 13 under a normal pressing operation (i.e., the center of the drum 20 is pressed downward). Since the high reflective structure 24 is formed using a material having a higher reflectivity than the spiral structure 25, each of the optical sensing elements 13 receives a light reflection signal having an intensity greater than the maximum value of the light reflection signal from the spiral structure 25. Therefore, a threshold value between the maximum value of the light reflection signal from the spiral structure 25 received by the optical sensing elements 13 and the value of the light reflection signal from the high reflective structure 24 received by the optical sensing elements 13 may be set in advance. Once the light reflection signals received by the optical sensing elements 13 all exceed this threshold value, it is determined that the optical dial device 1 is pressed as shown in FIG. 3A, and the operation signal indicating the normal pressing operation is output to the external device having the touch screen.

When the user presses the optical dial device 1 off center, (i.e., an edge of the drum 20 is pressed downward), only one side of the elastic body 30 is compressed so that the drum 20 is lowered and the drum 20 is formed in an inclined state. In the embodiment of the present invention, under the off-center pressing operation, only the high reflective structure 24 on the pressed side will be lowered to the position facing the optical sensing elements 13. The optical sensing elements 13 on this side receive the light reflection signal exceeding the threshold value as a result of facing the high reflective structure 24, and the optical sensing elements 13 on the opposite side still face the spiral structure 25 and receive the light reflection signal below the threshold value. Accordingly, when the intensities of the light reflection signals received by some of the optical sensing elements 13 exceed the threshold value, and the intensities of light reflection signals received by the remaining optical sensing elements 13 are lower than the threshold value, it is determined that the optical dial device 1 is pressed as shown in FIG. 3B, and the operation signal indicating the off-center pressing operation is output to the external device having the touch screen.

According to the optical dial device 1 described above, the present invention also provides an off-center pressing operation input mode, in addition to normal pressing and rotating input modes. Therefore, the functionality and convenience of the optical dial device 1 are further increased. The user can define the function of the off-center pressing operation, such as going back one step.

In another embodiment of the optical dial device 1, the high reflective structure 24 can be substituted with a low reflective structure (not shown in the figures), and the remaining elements are the same as those shown in FIG. 2A. The low reflective structure is formed using a material having a lower reflectivity than the spiral structure 25, each of the optical sensing elements 13 receives a light reflection signal having an intensity that is lower than the minimum value of the light reflection signal from the spiral structure 25. Therefore, the threshold value between the minimum value of the light reflection signal from the spiral structure 25 received by the optical sensing elements 13 and the value of the light reflection signal from the low reflective structure received by the optical sensing elements 13 may be set in advance. Once the light reflection signals received by the optical sensing elements 13 are all below this threshold value, it is determined that the optical dial device 1 is normally pressed, and the operation signal indicating the normal pressing operation is output to the external device having the touch screen.

When the user presses the optical dial device 1 off center, only the low reflective structure on the pressed side will be lowered to the position facing the optical sensing elements 13. The optical sensing elements 13 on this side receive the light reflection signal below the threshold value as a function of facing the low reflective structure, and the optical sensing elements 13 on the opposite side still face the spiral structure 25 and receive the light reflection signal exceeding the threshold value. Similarly, when the intensities of the light reflection signals received by some of the optical sensing elements 13 exceed the threshold value, and the intensities of light reflection signals received by the remaining optical sensing elements 13 are lower than the threshold value, it is determined that the optical dial device 1 is pressed off center, and the operation signal indicating the off-center pressing operation is output to the external device having the touch screen.

Note that, in the above embodiments, the present invention does not limit the pressing position when the off-center pressing operation is performed. In other words, no matter which edge of the optical dial device 1 is pressed, the optical dial device 1 will output the same off-center pressing command. However, the present invention is not limited thereto. In some embodiments, the bottom portion 11 of the base 10 of the present invention can be used as a positioning structure that allows only the optical dial device 1 to be placed in a specific placement direction, so that the position of the optical sensing elements 13 on the base 10 is fixed when the optical dial device 1 is placed on an external device. As such, the off-center pressing operation at different positions can be further defined by determining which of the light refection signals received by the optical sensing elements 13 exceeds the threshold value.

Figure 4:
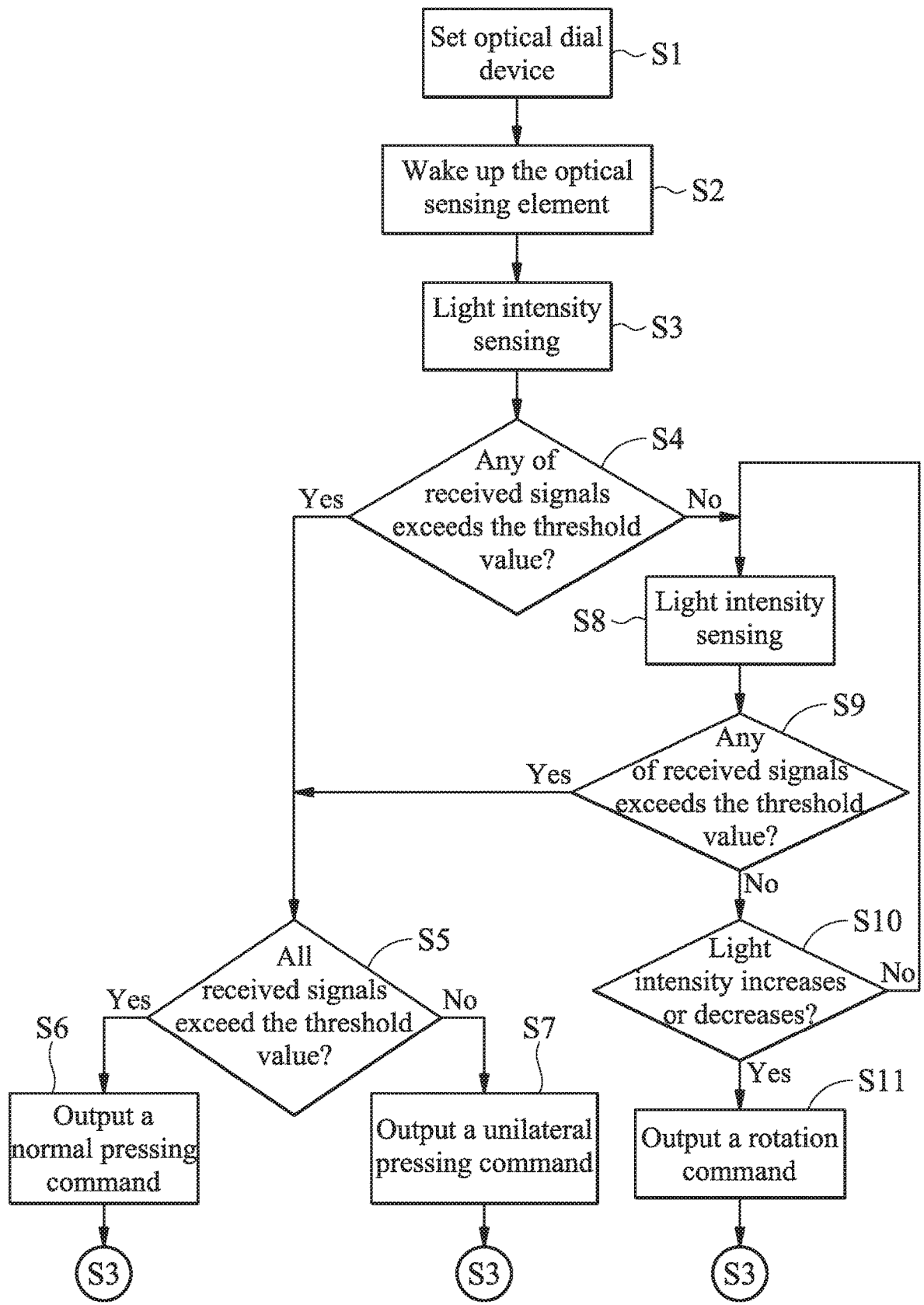
FIG. 4 is a flowchart showing an optical detection method for detecting an input operation mode of the optical dial device of FIG. 1 according to an embodiment of the present invention.

Next, an optical detection method for detecting the input operation mode of the optical dial device of the present invention is described. FIG. 4 is a flowchart showing an optical detection method for detecting an input operation mode of the optical dial device of FIG. 1 according to an embodiment of the present invention. As shown in FIG. 4, the optical dial device is placed on an external device having a touch screen to establish a connection with the external device in step S1. In step S2, the optical sensing elements inside the optical dial device are woken up by the connection with the external device. In step S3, the optical sensing elements perform light-intensity sensing. In step S4, it is determined whether any of the light refection signals received by the optical sensing elements exceeds a threshold value. If any of the light refection signals exceeds the threshold value, the process goes to step S5; if none of the light refection signals exceeds the threshold value, the process goes to step S8. In step S5, it is further determined whether all the light refection signals exceed the threshold value. If all the light refection signals exceed the threshold value, it means that the center of the optical dial device is pressed. Therefore, a normal pressing command is output to the external device in step S6. Thereafter, the process returns to step S3 to continue light-intensity sensing. If not all of the light refection signals exceed the threshold value (i.e., the difference between the light refection signals is large), it means that the edge of the optical dial device is pressed. Hence, an off-center pressing command is output to the external device in step S7, and then the process returns to step S3 to continue light-intensity sensing.

On the other hand, when it is determined that all the light refection signals received by the optical sensing elements do not exceed the threshold value in step S4, the next light-intensity sensing is performed in step S8. Next, whether any one of the received light refection signals exceeds the threshold value is determined again in step S9. If one or more of the received light refection signals exceeds the threshold value, the process goes to step S5. In step S10, if none of the received light refection signals exceeds the threshold value, whether the light refection signal is increased or decreased is determined according to the light refection signal detected in step S8 and the light intensity signal detected in step S3. If the light intensity does not change, the process returns to step S8. If the light refection signal is increased or decreased, it means that the optical dial device is rotated. Therefore, a rotation command is output to the external device in step S11, and the process returns to step S3 to continue light-intensity sensing. Here, according to the increase in the light refection signal, the rotation command representing the rotation in a first direction (for example, in the counterclockwise direction) may be output to the external device. Furthermore, according to the decrease in the light refection signal, a rotation command representing the rotation in a second direction (for example, in the clockwise direction) may be output to the external device.

In the above optical detection method, various operation inputs including normal pressing, off-center pressing, clockwise rotation, and counterclockwise rotation operations of the optical dial device of the present invention can be completely detected. This optical detection method provides more ways of operating compared to conventional optical dial devices.

However, the optical dial device of the present invention can also be operated in an operation mode capable of receiving a pressing operation only or receiving a rotation operation only. For example, FIGS. 5 and 6 are flowcharts respectively showing an optical detection method for detecting an input operation mode of the optical dial device of FIG. 1 according to another embodiment of the present invention.

Figure 5:
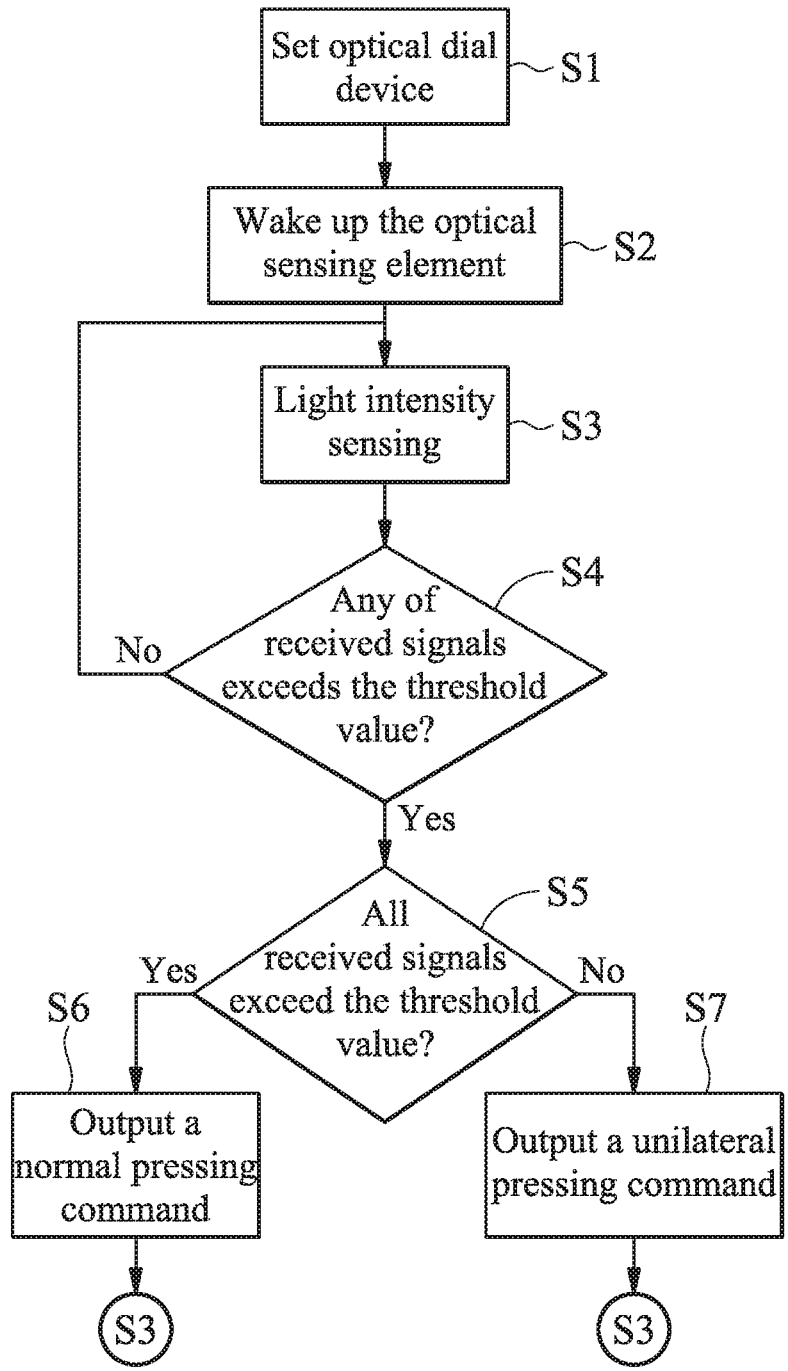
FIG. 5 is a flowchart showing an optical detection method for detecting an input operation mode of the optical dial device of FIG. 1 according to another embodiment of the present invention.

In an embodiment where an optical dial device receives only a pressing operation, as shown in FIG. 5, the optical dial device is placed on an external device having a touch screen to establish a connection with the external device in step S1. In step S2, the optical sensing elements inside the optical dial device are woken up by the connection with the external device. In step S3, the optical sensing elements perform light-intensity sensing. In step S4, it is determined whether any one of the light refection signals received by the optical sensing elements exceeds a threshold value. If any of the light refection signals exceeds the threshold value, the process goes to step S5; if none of the light refection signals exceeds the threshold value, the process returns to step S3. In step S5, whether all the light refection signals exceed the threshold value is further determined. If all the light refection signals exceed the threshold value, it means that the center of the optical dial device is pressed. Therefore, a normal pressing command is output to the external device in step S6. Thereafter, the process returns to step S3 to continue light-intensity sensing. If not all of the light refection signals exceed the threshold value (i.e., the difference between the light refection signals is large), the edge of the optical dial device is pressed, so that an off-center pressing command is output to the external device in step S7. Thereafter, the process returns to step S3 to continue light-intensity sensing.

Figure 6:
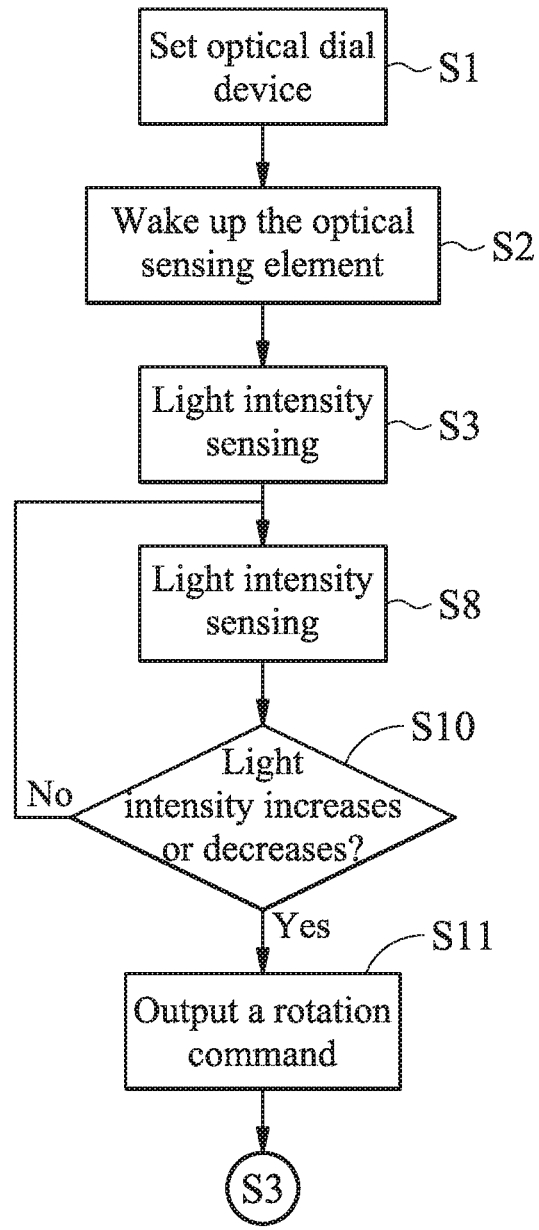
FIG. 6 is a flowchart showing an optical detection method for detecting an input operation mode of the optical dial device of FIG. 1 according to another embodiment of the present invention.

In an embodiment where an optical dial device receives only a rotating operation, as shown in FIG. 6, the optical dial device is placed on an external device having a touch screen to establish a connection with the external device in step S1. In step S2, the optical sensing elements inside the optical dial device are woken up by the connection with the external device. In step S3, the optical sensing elements perform light-intensity sensing. Next, the process proceeds to step S8 to perform the next light-intensity sensing. Then in step S10, according to the light refection signal detected in step S8 and the light refection signal detected in step S3, whether the light refection signal is increased or decreased is determined. If the light intensity does not change, the process returns to step S8. If the light refection signal is increased or decreased, it means that the optical dial device is rotated. Therefore, a rotation command is output to the external device in step S11, and the process returns to step S3 to continue light-intensity sensing. Here, according to the increase in the light refection signal, the rotation command representing the rotation in a first direction (for example, in the counterclockwise direction) may be output to the external device may be output to the external device. Furthermore, according to the decrease in the light refection signal, a rotation command representing the rotation in a second direction (for example, in the clockwise direction) may be output to the external device.

According to the optical dial device and the optical detection method of the embodiments described above, the operation modes of the dial device are increased and the functionality and convenience of the dial devices are greatly improved.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An optical dial device, comprising:
a base, including a plurality of optical sensing elements that are disposed at a predetermined height along a circumference of a side surface of the base; and
a drum covering the base in such a manner that the drum may be moved close to the base, away from the base, and rotatable relative to the base,
wherein the drum comprises:
an opening accommodating the base;
a reflective structure disposed along the circumference of an inner wall surface of the drum and located a first distance away from the opening; and
a spiral structure disposed along the circumference of the inner wall surface of the drum and located a second distance away from the opening, wherein the spiral structure continuously varies the distance between the inner wall surface of the drum and the side surface of the base along the circumference,
wherein the second distance is shorter than the first distance, and the spiral structure is located at the predetermined height when no force is applied on the optical dial device.

2. The optical dial device as claimed in claim 1, wherein the reflective structure is made of a material having a higher reflectivity than the spiral structure, and when the entire drum and the base are close to each other based on an operation input received by the optical dial device, the reflective structure is moved to the predetermined height, such that the plurality of optical sensing elements simultaneously receive light reflection signals having high intensities, and the optical dial device outputs an operation signal indicating a normal pressing operation to an external device.

3. The optical dial device as claimed in claim 1, wherein the reflective structure is made of a material having a lower reflectivity than the spiral structure, and, and when the entire drum and the base are close to each other, the reflective structure is moved to the predetermined height, the plurality of optical sensing elements simultaneously receive light reflection signals having low intensities, and the optical dial device outputs an operation signal indicating a normal pressing operation to an external device.

4. The optical dial device as claimed in claim 1, wherein when the drum rotates relative to the base based on an operation input received by the optical dial device, light reflection signals received by the plurality of optical sensor elements are continuously raised or lowered, so that the optical dial device outputs an operation signal indicating a rotation operation to an external device.

5. The optical dial device as claimed in claim 4, wherein when the light reflection signals received by the plurality of optical sensing elements are continuously raised, the operation signal output by the optical dial device represents a first direction in a circumferential direction.

6. The optical dial device as claimed in claim 5, wherein when the light reflection signals received by the plurality of optical sensing elements are continuously lowered, the operation signal output by the optical dial device represents a second direction in the circumferential direction, wherein the second direction is opposite to the first direction.

7. The optical dial device as claimed in claim 1, wherein the reflective structure is made of a material having a higher reflectivity than the spiral structure, and when one side of the drum and the base are moved close to each other and the other side of the drum is moved away from the base based on an operation input received by the optical dial device, a portion of the reflective structure is moved to the predetermined height, so that at least one of the plurality of optical sensing elements receives light reflection signals having high intensities, and the remaining optical sensing elements receive light reflection signals having low intensities, thereby the optical dial device outputs an operation signal indicating an off-center pressing operation to an external device.

8. The optical dial device as claimed in claim 1, wherein the reflective structure is made of a material having a lower reflectivity than the spiral structure, and
when one side of the drum and the base are moved close to each other and the other side of the drum is moved away from the base based on an operation input received by the optical dial device, a portion of the reflective structure is moved to the predetermined height, so that at least one of the plurality of optical sensing elements receives light reflection signals having low intensities, and the remaining optical sensing elements receive light reflection signals having high intensities, thereby the optical dial device outputs an operation signal indicating an off-center pressing operation to an external device.

* * * * *